United States Patent
Ping et al.

(10) Patent No.: US 6,509,227 B1
(45) Date of Patent: *Jan. 21, 2003

(54) FORMATION OF CONDUCTIVE RUGGED SILICON

(75) Inventors: Er-Xuan Ping, Boise, ID (US); Randhir Thakur, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/503,572

(22) Filed: Feb. 14, 2000

Related U.S. Application Data

(63) Continuation of application No. 08/808,235, filed on Feb. 28, 1997, now Pat. No. 6,069,053.

(51) Int. Cl.⁷ .......................................... H01L 21/8242
(52) U.S. Cl. ........................ 438/255; 438/398; 438/964
(58) Field of Search ............................... 438/255, 398, 438/964

(56) References Cited

U.S. PATENT DOCUMENTS

| | | | |
|---|---|---|---|
| 4,904,611 A | 2/1990 | Chiang et al. | 437/21 |
| 5,149,676 A | 9/1992 | Kim et al. | 437/228 |
| 5,202,278 A | 4/1993 | Matthews et al. | 437/47 |
| 5,208,479 A | 5/1993 | Matthews et al. | 257/534 |
| 5,242,507 A | 9/1993 | Iverson | 148/33 |
| 5,242,855 A | 9/1993 | Oguro | 437/109 |
| 5,266,514 A | 11/1993 | Tuan et al. | 437/52 |
| 5,278,091 A | 1/1994 | Fazan et al. | 437/52 |
| 5,318,920 A | 6/1994 | Hayashide | 437/47 |

(List continued on next page.)

FOREIGN PATENT DOCUMENTS

| | | | | |
|---|---|---|---|---|
| GB | 2313231 A | * | 11/1997 | H01L/21/461 |
| JP | 09298284 A | * | 11/1997 | H01L/21/108 |

OTHER PUBLICATIONS

H. Watanabe et al., "A New Cylindrical Capacitor Using Hemispherical Grained Si (HSG–Si) for 256 Mb DRAMs", *IEEE*, pp. 10.1.1–10.1.4 (1992).

H. Watanabe et al., "Device application and structure observation for hemispherical–grained Si", *J. App. Phys.*, 71, 3538–3543 (1992).

H. Watanabe et al., "Hemispherical Grained Silicon (HSG–Si) Formation on In–Situ Phosphorous Doped Amorphous–Si Using The Seeding Method", Extended Abstracts of the 1992 International Conference on Solid State Devices and Materials, 422–424 (1992).

H. Pierson, "Chemical Vapor Deposition" *Handbook of Chemical Vapor Deposition (CVD)*, Noyes Publications, Park Ridge, NJ, p. 184 (1992).

*Primary Examiner*—Richard Booth
*Assistant Examiner*—Jennifer M. Kennedy
(74) *Attorney, Agent, or Firm*—Mueting, Raasch & Gebhardt, P.A.

(57) ABSTRACT

The present invention provides methods of forming in situ doped rugged silicon and semiconductor devices incorporating conductive rugged silicon. In one aspect, the methods involve forming a layer of doped amorphous silicon on a substrate at a substantially constant deposition temperature; and converting the amorphous silicon layer into hemispherical grain silicon by annealing the amorphous silicon layer at substantially the deposition temperature while varying pressure. In another aspect, the methods involve forming a discontinuous first layer of doped silicon on a substrate; forming a second layer of amorphous silicon on the first layer of doped silicon and the substrate not covered by the first layer of doped silicon; and annealing the first and second layers. In yet another aspect, the methods involve forming a discontinuous first layer of silicon on a substrate and forming a second conformal layer of doped amorphous silicon on the first layer of doped silicon.

29 Claims, 3 Drawing Sheets

U.S. PATENT DOCUMENTS

| | | | |
|---|---|---|---|
| 5,324,679 A | 6/1994 | Kim et al. .................... 437/52 |
| 5,366,917 A | 11/1994 | Watanabe et al. ............ 437/47 |
| 5,385,863 A | 1/1995 | Tatsumi et al. |
| 5,407,534 A | 4/1995 | Thakur ..................... 156/662 |
| 5,418,180 A | 5/1995 | Brown ........................ 437/60 |
| 5,444,013 A | 8/1995 | Akram et al. ................. 437/60 |
| 5,550,070 A | 8/1996 | Funai et al. .................. 437/41 |
| 5,573,968 A | 11/1996 | Park ........................... 437/52 |
| 5,583,070 A * | 12/1996 | Liao et al. ................... 437/52 |
| 5,619,057 A | 4/1997 | Komatsu |
| 5,634,974 A | 6/1997 | Weimer et al. |
| 5,639,685 A | 6/1997 | Zahurak et al. |
| 5,656,531 A | 8/1997 | Thakur et al. |
| 5,700,710 A | 12/1997 | Zenke ......................... 437/60 |
| 5,714,415 A * | 2/1998 | Oguro ....................... 438/486 |
| 5,721,171 A | 2/1998 | Ping et al. |
| 5,770,500 A * | 6/1998 | Batra et al. ................. 438/255 |
| 5,856,007 A | 1/1999 | Sharan et al. |
| 5,858,852 A * | 1/1999 | Aiso ......................... 438/396 |
| 5,882,979 A | 3/1999 | Ping et al. |
| 5,888,295 A | 3/1999 | Sandhu et al. |
| 5,937,314 A | 8/1999 | Ping et al. |
| 6,069,053 A * | 5/2000 | Ping et al. .................. 438/398 |
| 6,153,466 A | 11/2000 | Yew et al. |

* cited by examiner

FORMATION OF CONDUCTIVE RUGGED SILICON

This is a continuation of application Ser. No. 08/808,235, filed Feb. 28, 1997, (allowed), which is incorporated herein by reference is now U.S. Pat. No. 6,069,053.

FIELD OF THE INVENTION

The present invention relates to the field of semiconductor manufacturing. More particularly, the present invention provides methods of obtaining conductive rugged silicon.

BACKGROUND OF THE INVENTION

Electrically conductive rugged silicon surfaces are useful in the manufacturing of dynamic semiconductor storage devices requiring storage node capacitor cell plates large enough to maintain adequate charge, i.e., capacitance, in the face of parasitic capacitances and noise that may be present during operation of a circuit including the storage devices. Maintaining storage node capacitance is especially important due to the continuing increases in Dynamic Random Access Memory (DRAM) array density.

Such DRAM devices, among others, rely on capacitance stored between two conductors separated by a layer of dielectric material. One method of increasing the capacitance of a capacitor formed using conductive polysilicon layers is to increase the surface area of the conductors. Using conductive rugged silicon for the first conductor is one method of increasing the surface area of the conductors because the later-deposited dielectric layer and second conductor will typically conform to the surface of the first deposited conductor.

Hemispherical grain silicon (commonly referred to as HSG silicon) is one example of a silicon layer with a rugged surface, i.e., a surface that is not smooth. Hemispherical grain silicon can be obtained by a number of methods including Low Pressure Chemical Vapor Deposition (LPCVD) at conditions resulting in a layer of roughened polysilicon. Another method includes depositing a layer of amorphous silicon, followed by high temperature seeding and annealing to cause the formation of HSG silicon.

The silicon layers to be converted into HSG silicon or deposited as HSG silicon are not, however, typically in situ doped during deposition because in situ doping of the amorphous silicon can result in crystallites within the amorphous silicon layer. As a result, additional steps, such as seeding and/or annealing are required to reliably transform the in situ doped, generally amorphous silicon into rugged hemispherical grain silicon. Those additional steps increase cost and decrease throughput.

SUMMARY OF THE INVENTION

The present invention provides methods of forming in situ conductively doped rugged silicon. In one aspect, the present invention provides a method including steps of forming a layer of doped amorphous silicon on a substrate at a substantially constant deposition temperature; and converting the amorphous silicon layer into hemispherical grain silicon by annealing the amorphous silicon layer at substantially the deposition temperature while varying pressure.

In another aspect, the present invention provides a method of forming hemispherical grain silicon including steps of forming a layer of doped amorphous silicon on a substrate at a substantially constant deposition temperature of about 565 to about 575° C.; and converting the amorphous silicon layer into hemispherical grain silicon by annealing the amorphous silicon layer at substantially the deposition temperature while varying pressure.

In another aspect, the present invention provides a method of forming hemispherical grain silicon including steps of forming a layer of in situ doped amorphous silicon on a substrate at a substantially constant deposition temperature; forming a layer of undoped amorphous silicon on the doped amorphous silicon layer at the deposition temperature; and converting the doped and undoped amorphous silicon layers into hemispherical grain silicon by annealing the silicon layers at substantially the deposition temperature while varying pressure.

In another aspect, the present invention provides a method of forming hemispherical grain silicon including steps of forming a layer of doped amorphous silicon on a substrate at a substantially constant deposition temperature of about 565 to about 575° C.; forming a layer of undoped amorphous silicon on the doped amorphous silicon layer at the deposition temperature; and converting the doped and undoped amorphous silicon layers into hemispherical grain silicon by annealing the silicon layers at substantially the deposition temperature while varying pressure.

In another aspect, the present invention provides a method of forming hemispherical grain silicon including steps of forming a discontinuous first layer of doped silicon on a substrate; forming a second layer of amorphous silicon on the first layer of doped silicon and the substrate not covered by the first layer of doped silicon; and annealing the first and second layers.

In another aspect, the present invention provides a method of forming hemispherical grain silicon including steps of forming a discontinuous first layer of doped silicon on a substrate at a deposition temperature of about 600° C. or greater, the first layer having a concentration of dopant of about $10^{20}$ atoms/cm$^3$ or greater; forming a second layer of amorphous silicon on the first layer of doped silicon and the substrate not covered by the first layer of doped silicon; and annealing the first and second layers.

In another aspect, the present invention provides a method of forming hemispherical grain silicon including steps of forming a discontinuous first layer of doped silicon on a substrate; removing a portion of the first layer of doped silicon from the substrate; forming a second layer of amorphous silicon on the first layer of doped silicon and the substrate not covered by the first layer of doped silicon; and annealing the first layer of doped silicon and the second layer of amorphous silicon to form hemispherical grain silicon.

In another aspect, the present invention provides a method of forming hemispherical grain silicon including steps of forming a discontinuous first layer of doped silicon on a substrate at a temperature of about 600° C. or above, wherein the concentration of dopant in the first layer of doped silicon is about $10^{20}$ atoms/cm$^3$ or greater; removing a portion of the first layer of doped silicon from the substrate; forming a second layer of doped amorphous silicon on the first layer of doped silicon and the substrate not covered by the first layer of doped silicon; and annealing the first layer of doped silicon and the second layer of doped amorphous silicon to form hemispherical grain silicon.

These and other features and advantages of methods according to the present invention are described in the detailed description of the invention below.

DETAILED DESCRIPTION OF THE INVENTION

The present invention comprises methods of providing conductive rugged silicon from an in situ doped layer of amorphous silicon. As discussed above, rugged silicon, including hemispherical grain silicon, is particularly useful in the manufacture of DRAM. It should be understood, however, that the methods of providing rugged and/or hemispherical grain silicon according to the present invention could be used in any application or structure in which increased surface area in a layer of conductive silicon would be useful.

Furthermore, the methods of the present invention are particularly well-suited for providing rugged silicon on a surface of a semiconductor substrate or substrate assembly, referred to herein generally as "substrate," used in forming integrated circuits, such as a silicon wafer, with or without layers or structures formed thereon. It is to be understood that the methods of the present invention are not limited to deposition on silicon wafers; rather, other types of wafers (e.g., gallium arsenide, etc.) can be used as well. Also, the methods of the present invention can be used in connection with silicon-on-insulator or silicon-on-sapphire technology. In addition, substrates other than semiconductor substrates or substrate assemblies can be used in connection with the present invention. These include, for example, fibers, wires, etc. If the substrate is a semiconductor substrate or substrate assembly, the rugged silicon can be formed directly on the lowest semiconductor surface of the substrate, or they can be formed on any variety of other layers or structures formed on the substrate.

Figure 1:
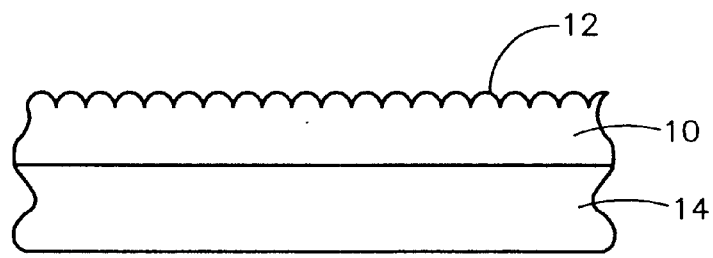
FIG. 1 is a cross-sectional schematic diagram of one layer of HSG silicon produced according to the present invention.

FIG. 1 depicts a layer 10 of HSG silicon formed on a substrate 14. The layer 10 of HSG silicon has a roughened surface 12 that contributes to the increased surface area desired in, for example capacitor structures.

Hemispherical grain silicon can be formed from a layer of in situ doped amorphous silicon using a single temperature process according to the present invention in which a layer of doped amorphous silicon is deposited on a substrate at a substantially constant deposition temperature. The preferred temperature range lies in the amorphous-polysilicon transition zone, i.e., the range of temperatures above which substantially amorphous silicon would typically be deposited and below which substantially polycrystalline silicon would typically be deposited. More specifically, the deposition temperature is preferably between about 560° C. to about 590° C., more preferably between about 565° C. to about 575° C.

Although the deposition temperature is above typical amorphous silicon deposition temperatures, the formation of polysilicon can be reduced by increasing the silicon deposition rate to the point at which the deposition time for the desired thickness of silicon is below the incubation time needed for substantial polysilicon formation at the deposition conditions (pressure, temperature, gas flow rate, etc.).

One method of increasing the silicon deposition rate is to increase the flow rate of the gas used to form the silicon layer. If silane is used as the growth gas, it is preferably provided at a flow rate of about 50 standard cubic centimeters per minute (sccm) or greater, more preferably about 100 sccm or greater, and even more preferably at about 200 sccm or greater. By providing an increased flow rate of the growth gas, the formation of polysilicon can be reduced by increasing the overall rate of silicon deposition in spite of the relatively high deposition temperatures. As a result, the time needed to deposit a layer of silicon of the desired thickness can be maintained below polysilicon incubation intervals.

Alternatively or in addition to increasing the flow rate of the growth gas, another technique to provide for amorphous silicon deposition is to use one or more growth gases that are more reactive than silane. Examples of more reactive gases include disilane and silicochloroform. The more reactive gases can be used alone, in combination with each other, in combination with silane, or together in combination with silane (i.e., a mixture of silane, disilane, and silicochloroform).

Yet another technique useful to provide for amorphous silicon deposition is to increase the pressure in the deposition chamber. This technique can be used alone or in combination with increased flow rates and/or more reactive growth gases to provide for amorphous silicon formation.

Regardless of the technique or techniques used, the desired result in methods according to the present invention is to limit or control the formation of polysilicon during the deposition of a substantially amorphous layer of in situ doped silicon on the substrate. After formation of the substantially amorphous in situ doped layer of silicon, the subsequent annealing step can take place at substantially the same temperature at which the silicon was first deposited. The crystallization of the substantially amorphous layer of silicon takes place after the pressure in the chamber has been reduced while the temperature is maintained substantially constant.

It is theorized that the crystallization of the amorphous silicon during the annealing period results from spontaneous crystallization inside the layer of in situ doped amorphous silicon as opposed to atom surface diffusion (which is typically relied on in conventional approaches to providing HSG silicon from amorphous silicon such as seeding).

One advantage of this single-temperature process is that the impact of the process used to obtain the desired conductive hemispherical grain silicon on the thermal budget of the integrated circuit can be reduced because no subsequent high temperature anneal step is required to form the hemispherical grain silicon. The thermal budget for fabrication of an integrated circuit is that combination of maximum time and temperature of heat treatments utilized in the fabrication of the integrated circuit. An integrated circuit can only be subjected to a limited number of thermal steps for a limited amount of time before its electrical performance is potentially detrimentally affected. For example, exceeding the thermal budget may also cause dopant gradients at junctions between two regions in an integrated circuit to diffuse, such that the potential barrier between the two regions is altered. Furthermore, thermal steps often cause dopants to migrate into undesired regions, altering device characteristics. Using the method of the present invention to obtain conductive hemispherical grain silicon can reduce the portion of the thermal budget expended to obtain the desired rugged surfaces provided by hemispherical grain silicon.

Figure 2:
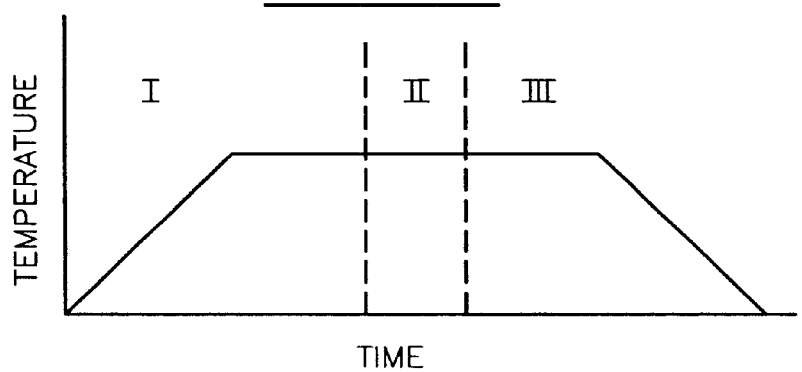
FIG. 2 is a graph of deposition temperature (y-axis) as a function of time (x-axis) in one method of providing HSG silicon according to the present invention.

FIG. 2 illustrates a time-temperature curve for one process according to the present invention. In Zone I the process or deposition temperature in the chemical vapor deposition chamber is increased until it lies with the transition zone as described above. Typically this temperature is about 560° to about 590° C. It is preferred that the silicon layer deposited in Zone I is in situ doped amorphous silicon. By amorphous, it is meant that the layer is substantially amorphous, although small amounts of crystallized silicon may be intermixed in the layer. The dopant will typically be phosphorous (provided as $PH_3$), although any other suitable dopants could be provided in place of, or in addition to, phosphorous.

As one example, the gases provided in Zone I could include silane, disilane, or a combination thereof in addition to $PH_3$ as the source of the dopant. These gases may or may not be diluted with one or more suitable carrier gases as desired.

Figure 3:
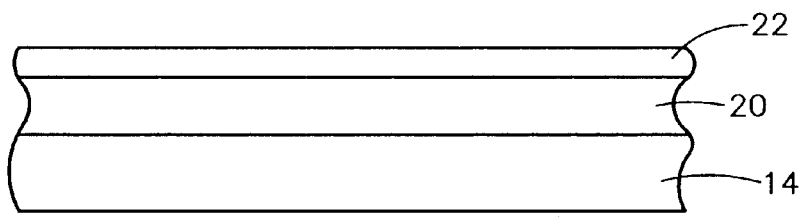
FIG. 3 is a cross-sectional schematic diagram of one method including a cap layer of undoped silicon.

A potential additional step in this method involves a Zone II in which the dopant gas is eliminated to provide a cap layer of undoped or lightly doped amorphous silicon over the doped layer of silicon. The structure formed is depicted in FIG. 3 where a layer of doped amorphous silicon 20 is located on substrate 14. The cap layer 22 of undoped or lightly doped amorphous silicon is provided over the layer 20 of doped amorphous silicon. The cap layer 22 may enhance formation of hemispherical grain silicon due to surface mobility enhancement.

In addition to surface mobility enhancement, the change in dopant concentration between the doped amorphous layer 20 and undoped or lightly doped cap layer 22 results in a diffusion gradient between the layers. It is theorized that diffusion, i.e., movement, of the dopant atoms from the doped layer 20 into the undoped or lightly doped cap layer 22 during crystallization may enhance the grain height in the resulting crystallized material because the dopant atoms are generally moving or diffusing towards the exposed surface of the undoped or lightly doped cap layer 22.

The relative variations in dopant concentration between the doped layer 20 and undoped or lightly doped cap layer 22 can be adjusted to potentially provide additional control over the grain height of the resulting hemispherical grain silicon layer. For example, a heavily doped amorphous layer 20 and undoped amorphous cap layer 22 may provide a more rugged surface than, for example, a heavily doped amorphous layer 20 and lightly doped amorphous cap layer 22. The change in grain height may be, in part, attributed to the different diffusion gradients in the two examples. In other words, a higher diffusion gradient (caused by an increased variation in dopant concentration in the amorphous silicon) will typically result in a more rugged surface while a lower diffusion gradient will typically result in a layer with reduced grain height (provided all other process parameters are relatively unchanged).

The optional cap layer 22 may also provide the advantage of reducing out-diffusion of the dopant from layer 20 during the subsequent annealing step during which the amorphous silicon layers 20 and 22 are transformed into the desired HSG silicon layer 10 (see FIG. 1).

As indicated above, the method depicted in the graph of FIG. 2 includes an annealing step that occurs in Zone III. Unlike methods in which annealing involves increasing the CVD chamber temperature, the method according to the present invention involves maintaining the chamber temperature within the transition zone between amorphous and polysilicon formation.

To induce the crystallization necessary to form HSG silicon from the amorphous silicon layer or layers, the pressure in the CVD chamber is varied during Zone III. The pressure in the chamber will typically be held from about 200 mTorr to about 20 Torr during annealing. By controlling the chamber pressure, the ruggedness of the HSG silicon layer can be affected. Higher chamber pressures result in smoother HSG silicon while lower pressures produce more pronounced surface features. In any event, control over the ruggedness of the surface features is accomplished by chamber pressure control.

Figure 4:
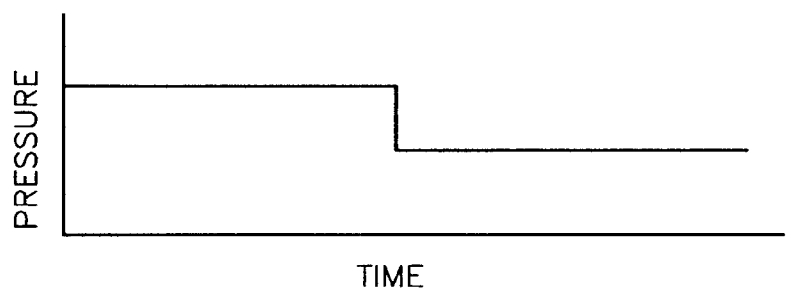
FIG. 4 is a graph of pressure (y-axis) as a function of time (x-axis) in the method of FIG. 2.

FIG. 4 depicts pressure in the CVD chamber during the process. As shown, pressure and temperature remain substantially constant during deposition of the doped amorphous silicon layer and undoped cap layer (if any). In Zone III, however, pressure in the CVD chamber is reduced while temperature is held constant to produce the desired HSG silicon layer 10 on substrate 14 (see FIG. 1).

Although the single temperature process described in this application generally involves holding the temperature at a substantially constant level during deposition and subsequent annealing, it may be possible in some situations to reduce the temperature during annealing (while also reducing pressure to initiate crystallization). Reducing temperature during annealing would further reduce the impact of the HSG silicon formation process on the thermal budget.

Figure 5:
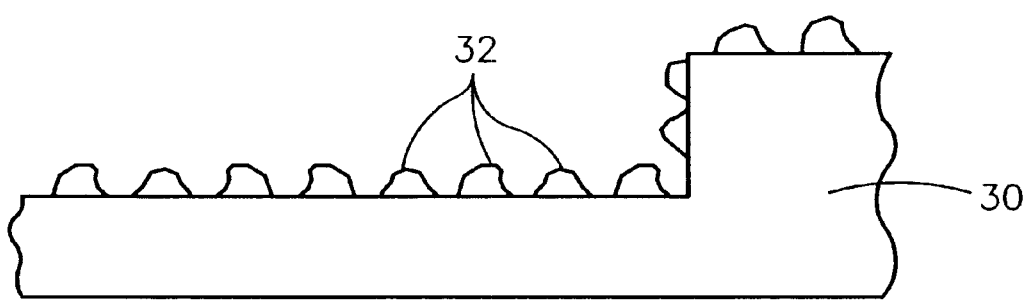
FIG. 5 is a cross-sectional schematic diagram of the formation of a discontinuous first layer of polysilicon in one method of providing HSG silicon according to the present invention.
Figure 6:
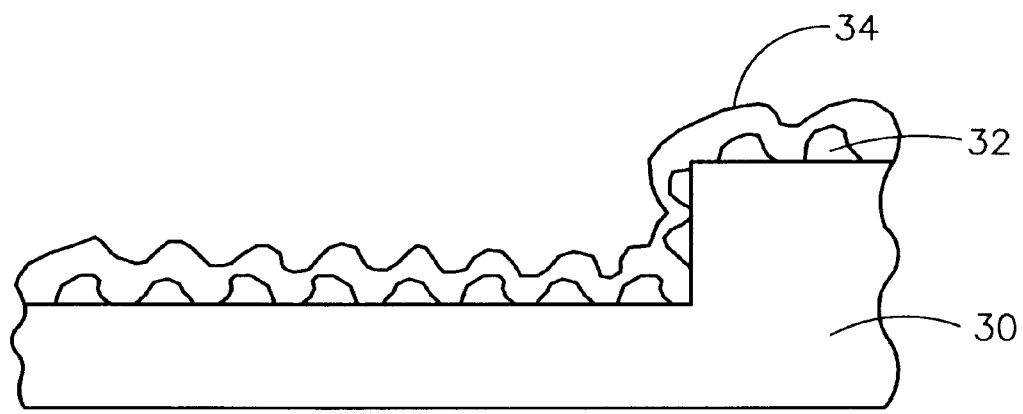
FIG. 6 is a cross-sectional schematic diagram of the formation of a second layer of amorphous silicon on the discontinuous first layer depicted in FIG. 5.
Figure 7:
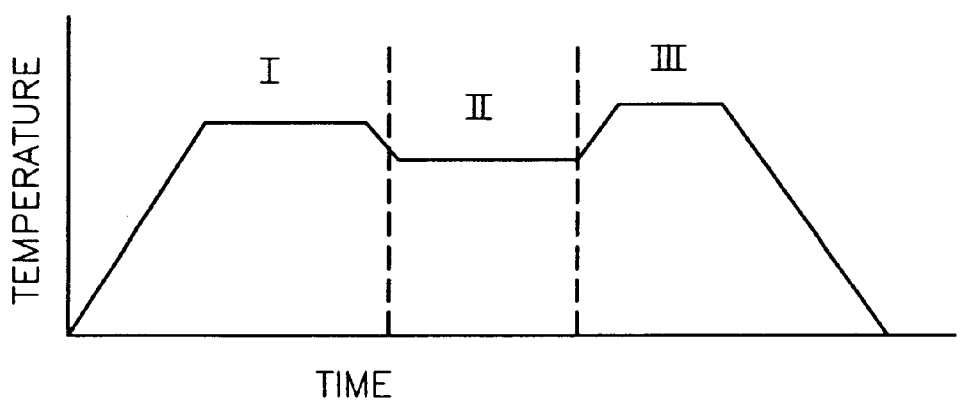
FIG. 7 is a graph of deposition temperature (y-axis) as a function of time (x-axis) in another method of providing HSG silicon according to the present invention.

Turning now to FIGS. 5–7, an alternative method for providing HSG silicon according to the present invention will be described. Like the first method, this method also begins with an initial step of depositing a first layer 32 of doped silicon on a substrate 30 (see FIG. 5) in a chemical vapor deposition chamber. As depicted, this layer 32 is discontinuous, i.e., it does not completely cover the underlying substrate 30. Preferably, the layer 32 forms substantially distinct islands of doped silicon on the surface of the substrate 30. It is preferred that the discontinuous silicon layer 32 be substantially amorphous silicon as opposed to polysilicon.

To provide the discontinuous layer 32, it is preferred that the temperature in the deposition chamber be held at about 600° C. or above to provide for discontinuous silicon growth in layer 32. Although these temperatures may typically be associated with the formation of crystalline polysilicon, layer 32 can be deposited as substantially amorphous silicon by maintaining the temperature for a relatively short period of time, i.e., below polysilicon incubation intervals. Typically, the time during which the layer 32 is deposited should be limited to about 3 minutes or less, more preferably about 1.5 minutes or less. To ensure that a sufficient amount of heavily doped amorphous silicon is deposited in the substantially discontinuous areas making up layer 32, it may also be helpful to increase the flow rate of the source gas and/or use more reactive source gases as discussed with respect to the single temperature process described above.

To enhance the definition of the distinct areas or islands of layer 32, it may be advantageous to remove a portion of the layer 32 after formation, particularly where the taller or thicker areas of the layer 32 are connected by thinner areas of silicon layer. This step of removal can be accomplished in a wet or dry process. It may be helpful to provide the upper surface of the substrate 30 with a layer material such as silicon nitride, etc. that can act as an etch stop for the etching process used to partially remove the polysilicon layer 32. The removal step should be controlled to leave the majority of thicker areas of layer 32 on substrate 30, preferably as substantially distinct islands.

Layer 32 is formed relatively thin, preferably to a thickness of about 1000 Angstroms or less, more preferably about 300 Angstroms or less. Because of the discontinuous nature of the layer 32, the thickness is measured as the average of the maximum height of each of the substantially discontinuous islands making up layer 32.

Layer 32 is also preferably heavily in situ doped for electrical conductivity. One dopant is phosphorous, although any suitable dopant or combination of dopants could be used in layer 32. By heavily doped, layer 32 preferably contains a concentration of dopant of about $10^{20}$ atoms/cm$^3$ or greater, more preferably about $10^{21}$ atoms/cm$^3$ or greater.

After layer 32 has been formed and, if desired, a portion of the layer removed, a substantially continuous second layer 34 of amorphous silicon is deposited on the first discontinuous layer 32 as well as the exposed portions of the underlying substrate 30 by chemical vapor deposition. This layer 34 can be either doped or undoped as desired. After layer 34 has been deposited, both layers 32 and 34 can be annealed to further enhance the ruggedness of the resulting composite layer.

The change in dopant concentration between the doped discontinuous silicon layer 32 and undoped or lightly doped continuous silicon layer 34 results in a diffusion gradient between the layers. It is theorized that diffusion, i.e., movement, of the dopant atoms from the heavily doped layer 32 into the undoped or lightly doped layer 34 during crystallization may enhance the grain height in the resulting crystallized material because the dopant atoms are generally moving or diffusing towards the exposed surface of the undoped or lightly doped layer 34.

The relative variations in dopant concentration between the doped layer 32 and undoped or lightly doped layer 34 can be adjusted to potentially provide additional control over the grain height of the resulting hemispherical grain silicon layer. For example, a heavily doped amorphous layer 32 and undoped amorphous layer 34 may provide a more rugged surface than, for example, a heavily doped amorphous layer 32 and lightly doped amorphous layer 34. The change in grain height may be, in part, attributed to the different diffusion gradients in the two examples. In other words, a higher diffusion gradient (caused by an increased variation in dopant concentration in the amorphous silicon) will typically result in a more rugged surface while a lower diffusion gradient will typically result in a layer with reduced grain height (provided all other process parameters are relatively unchanged).

Some advantages to the method of providing HSG silicon as depicted in FIGS. 5 and 6 is that the resulting HSG silicon layer is typically homogeneously doped, substantially continuous over the desired area, provides the desired increased surface area for enhancing capacitance (if used in a capacitor structure), and provides good step coverage over existing structures on the substrate.

FIG. 7 is a graphical representation of the deposition temperature as a function of time for providing the layers depicted in FIGS. 5 and 6. As shown, the chamber or deposition temperature is held above the transition zone for amorphous to polysilicon deposition. Preferably, the deposition temperature during Zone I in FIG. 7 (in which layer 32 is formed) is about 600° C. or greater. After a sufficient amount of silicon has been deposited in Zone I, the temperature in the deposition chamber is reduced to levels at which the second layer 34 of substantially continuous amorphous silicon is deposited on the first layer 32 and the exposed portions of the substrate 30 (see FIG. 6). That portion of the process is represented by Zone II in FIG. 7. One preferred deposition temperature during Zone II is about 550° C.

Zone III in FIG. 7 depicts the increase in temperature typically used to anneal the first and second layers 32 and 34. Some preferred anneal temperatures are about 560° C. to about 650° C. Preferably, the time spent in Zone III is about 10 minutes when the anneal temperature is about 600° C. The annealing process results in the desired HSG silicon layer. Alternatively, as described above, no annealing may be performed provided that the discontinuous layer 34 is doped to provide the desired electrical conductivity.

Figure 8:
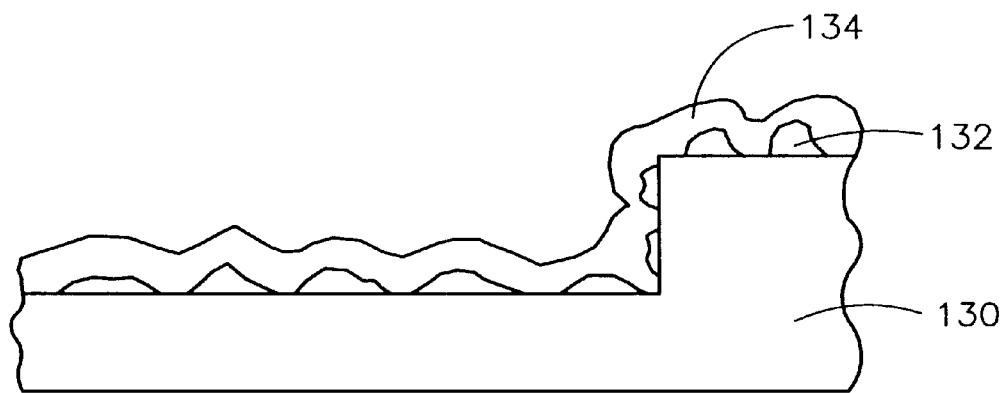
FIG. 8 is a cross-sectional schematic diagram of a layer of rugged silicon formed using a first discontinuous layer of silicon and a second conformal layer of silicon.

The present invention also includes methods of providing rugged silicon surfaces that may not result in the formation of hemispherical grain silicon. This method is similar to that depicted in FIGS. 5 and 6. Referring now to FIG. 8, a first discontinuous layer 132 of silicon is formed in the same manner as described above for discontinuous layer 32. Discontinuous silicon layer 32 can be doped or undoped.

After formation of the discontinuous layer 132 (including any selective removal of the layer 132 to enhance its discontinuous nature), a second conformal layer 134 of doped silicon can be deposited on the first layer 132 and any exposed portions of the substrate 130. Layer 134 is preferably doped to provide for electrical conductivity required to form a capacitor plate. In this method, no annealing step is required because the rugged surface is provided by the conformal nature of layer 134 over the rugged profile achieved with the discontinuous first layer 132. If no annealing occurs, hemispherical grain silicon may not be formed using layers 132 and 134. Alternatively, however, layers 132 and 134 can be converted into hemispherical grain silicon through an annealing step if desired.

Figure 9:
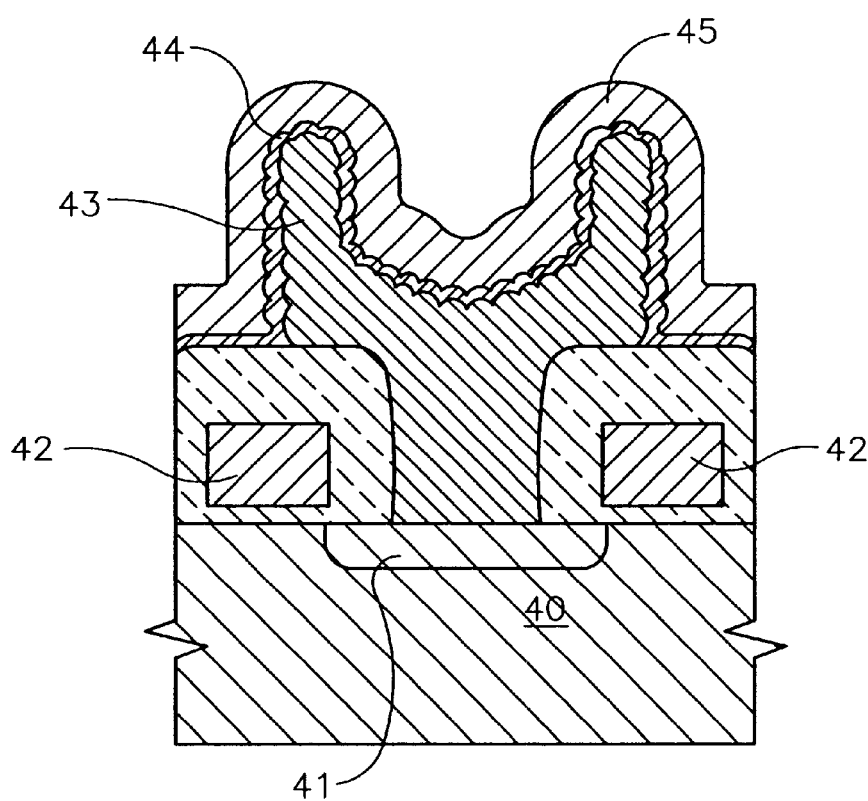
FIG. 9 is a cross-sectional schematic diagram of a capacitor including a layer of conductive rugged silicon formed using methods according to the present invention.

The methods of the present invention can be used to form conductive rugged silicon on any desired structure, but one method will be more specifically described as used in the construction of a capacitor electrode incorporating rugged silicon. Turning to FIG. 9, a substrate 40 including a diffusion region 41 is provided. Access gates 42 are located above the diffusion region 41 and the distance between the access gates 42 is spanned by the diffusion region 41. The capacitor electrode structure 43 connects to the diffusion region 41 between access gates 42. It is the surface of the upper portion of the capacitor electrode structure 43 that includes the desired conductive rugged silicon surface.

Any of the methods according to the present invention described herein can be used to provide the desired conductive rugged silicon surface on capacitor electrode structure 43. After the conductive rugged silicon is formed on structure 43, a layer 44 of dielectric is deposited thereon, followed by formation of a second capacitor electrode 45 on the dielectric 44 to complete the capacitor.

EXAMPLES

The following nonlimiting examples are provided to illustrate methods according to the present invention:

Example 1

A single temperature process for forming HSG silicon according to the present invention was performed as described below. A deposition temperature of 565° C. was maintained throughout the process. The substrate was a silicon wafer. The zones referred to correspond to the zones depicted in FIG. 2.

An amorphous layer of silicon was formed by providing a growth gas ($SiH_4$) to the CVD chamber at a rate of 200 sccm. A dopant gas comprising 0.5% $PH_3$ in nitrogen was also supplied to the chamber at a rate of 10 sccm to conductively dope the silicon. The pressure in the chamber was maintained at $200 \times 10^{-3}$ Torr. These conditions were held for about 20 minutes and resulted in the formation of a layer of amorphous silicon with a thickness of about 500 Angstroms. The above conditions defined Zone I as referred to in FIG. 2.

A cap layer of undoped amorphous silicon was formed over the doped amorphous silicon under the following conditions (Zone II in FIG. 2): a growth gas ($SiH_4$) was provided to the chamber at a rate of 200 sccm and the pressure in the chamber was maintained at $200 \times 10^{-3}$ Torr. These conditions were held for about 5 minutes to form a cap layer of undoped amorphous silicon with a thickness of about 200 Angstroms.

The two layers of amorphous silicon were then subjected to annealing in the same CVD chamber under the following conditions (Zone III in FIG. 2): a non-reactive gas (nitrogen) was provided to the chamber at a rate of 500 sccm and pressure in the chamber was raised to $300 \times 10^{-3}$ Torr. These conditions were maintained for about 30 minutes and resulted in the formation of HSG silicon.

Example 2

A layer of HSG silicon was provided by beginning with a discontinuous layer of silicon according to the present invention. The substrate was a silicon wafer. The zones referred to correspond to the zones depicted in FIG. 7.

A discontinuous layer of doped silicon was formed during Zone I of the process depicted in FIG. 7 by providing a growth gas ($SiH_4$) to the CVD chamber at a rate of 200 sccm. A dopant gas comprising 0.5% $PH_3$ in nitrogen was also supplied to the chamber at a rate of 10 sccm to conductively dope the discontinuous layer of silicon. The temperature in the chamber was held at 600° C. and the pressure in the chamber was maintained at $200 \times 10^{-3}$ Torr. These conditions were held for about 3 minutes and resulted in the formation of a discontinuous layer of doped silicon with a thickness of about 500 Angstroms.

Following formation of the discontinuous silicon layer, the temperature in the CVD chamber was reduced to 530° C. and the flow rate of the dopant gas was lowered to 5 sccm. Pressure in the chamber was maintained at $200 \times 10^{-3}$ Torr. These conditions were held for about 30 minutes to form a layer of doped amorphous silicon on the discontinuous layer, with the thickness of the doped amorphous layer being about 300 Angstroms. This portion of the process is represented as Zone II in FIG. 7.

The two layers of silicon were then subjected to annealing in the same CVD chamber under the following conditions (Zone III in FIG. 7): a nonreactive gas (nitrogen) was provided to the chamber at a flow rate of 500 sccm and pressure in the chamber was raised to $300 \times 10^{-3}$ Torr. The temperature in the chamber was also increased to about 570° C. and these conditions were maintained for about 30 minutes, resulting in the formation of conductive HSG silicon.

Although specific methods and examples have been illustrated and described herein, it will be appreciated by those of ordinary skill in the art that any arrangement that is calculated to achieve the same purpose may be substituted for the specific methods and examples described. This application is intended to cover any adaptations or variations of the present invention. Therefore, it is manifestly intended that this invention be limited only by the claims and the equivalents thereof.

What is claimed is:

1. A method of forming hemispherical grain silicon comprising:

forming a layer of doped amorphous silicon on a substrate at a substantially constant deposition temperature within a chamber at a chamber pressure; and converting the amorphous silicon layer into hemispherical grain silicon by annealing the amorphous silicon layer at substantially the deposition temperature or less at an annealing pressure that is different from the chamber pressure.

2. A method of forming hemispherical grain silicon comprising:

forming a layer of doped amorphous silicon on a substrate at a substantially constant deposition temperature of about 565 to about 575° C. within a chamber at a chamber pressure; and converting the amorphous silicon layer into hemispherical grain silicon by annealing the amorphous silicon layer at substantially the deposition temperature or less at an annealing pressure that is different from the chamber pressure.

3. A method according to claim 2 wherein the chamber pressure during annealing is about 20 mTorr to about 20 Torr.

4. A method of forming hemispherical grain silicon comprising:

forming a first layer of in situ doped amorphous silicon on a substrate at a deposition temperature;

forming a second layer of undoped amorphous silicon on the first layer, the second layer being formed at the deposition temperature within a chamber at a chamber pressure; and converting the first and second layers into hemispherical grain silicon by annealing the first and second layers at substantially the deposition temperature or less at an annealing pressure that is different from the chamber pressure.

5. A method of forming hemispherical grain silicon comprising:

forming a first layer of doped amorphous silicon on a substrate at a substantially constant deposition temperature of about 565 to about 575° C.;

forming a second layer of undoped amorphous silicon on the first layer, the second layer being formed at the deposition temperature within a chamber at a chamber pressure; and converting the first and second layers into hemispherical grain silicon by annealing the first and second layers at substantially the deposition temperature or less at an annealing pressure that is different from the chamber pressure.

6. A method according to claim 5 wherein the chamber pressure during annealing is about 20 mTorr to about 20 Torr.

7. A method for manufacturing a semiconductor device comprising:

forming a layer of doped amorphous silicon on a substrate at a substantially constant deposition temperature within a chamber at a chamber pressure;

converting the amorphous silicon layer into hemispherical grain silicon by annealing the amorphous silicon layer at substantially the deposition temperature or less at an annealing pressure that is different from the chamber pressure, wherein the hemispherical grain silicon forms a first electrode of a capacitor;

providing a layer of dielectric material on the first electrode; and providing a second electrode of the capacitor on the dielectric material.

8. A method of forming hemispherical grain silicon comprising:

forming a layer of doped substantially amorphous silicon on a substrate located within a chamber at a chamber pressure, wherein the substrate is heated to a deposition temperature during formation of the layer that is in a range of temperatures above which substantially amorphous silicon would typically be deposited and below which substantially polycrystalline silicon would typically be deposited; and annealing the layer of doped substantially amorphous silicon at substantially the deposition temperature or less at an annealing pressure that is different from the chamber pressure.

9. A method according to claim 8, wherein the range of temperatures is from about 560 degrees Celsius to about 590 degrees Celsius.

10. A method according to claim 8 wherein the chamber pressure during annealing is about 20 mTorr to about 20 Torr.

11. A method of forming hemispherical grain silicon comprising:

forming a first layer of doped substantially amorphous silicon on a substrate that is heated to a deposition temperature during formation of the first layer that is in a range of temperatures above which substantially amorphous silicon would typically be deposited and below which substantially polycrystalline silicon would typically be deposited;

forming a second layer of undoped substantially amorphous silicon on the first layer, the second layer being formed at the deposition temperature within a chamber at a chamber pressure; and annealing the first and second layers at substantially the deposition temperature or less at an annealing pressure that is different from the chamber pressure.

12. A method according to claim 11, wherein the range of temperatures is from about 560 degrees Celsius to about 590 degrees Celsius.

13. A method of forming hemispherical grain silicon comprising:

forming a layer of doped substantially amorphous silicon on a substrate located within a chamber at a chamber pressure by providing a growth gas to the chamber at a flow rate of about 50 sccm or greater, wherein the substrate is heated to a deposition temperature during formation of the first layer that is in a range of temperatures above which substantially amorphous silicon would typically be deposited and below which substantially polycrystalline silicon would typically be deposited; and annealing the layer of doped substantially amorphous silicon at substantially the deposition temperature or less at an annealing pressure that is different from the chamber pressure.

14. A method according to claim 13, wherein the flow rate of growth gas is about 100 sccm or greater.

15. A method according to claim 13, wherein the flow rate of growth gas is about 200 sccm or greater.

16. A method according to claim 13, wherein the growth gas comprises disilane.

17. A method according to claim 13, wherein at least a portion of the growth gas comprises a gas that is more reactive than silane.

18. A method according to claim 13, wherein at least a portion of the growth gas comprises a gas selected from the group consisting of disilane, silichloroform, and combinations thereof.

19. A method according to claim 13, wherein the growth gas is selected from the group consisting of disilane, silichloroform, and combinations thereof.

20. A method according to claim 13 wherein the chamber pressure during annealing is about 20 mTorr to about 20 Torr.

21. A method of forming hemispherical grain silicon comprising:

forming a first layer of doped substantially amorphous silicon on a substrate located in a chamber by providing a growth gas to the chamber at a flow rate of about 50 sccm or greater, wherein the substrate is heated to a deposition temperature during formation of the first layer that is in a range of temperatures above which substantially amorphous silicon would typically be deposited and below which substantially polycrystalline silicon would typically be deposited;

forming a second layer of undoped substantially amorphous silicon on the first layer, the second layer being formed at the deposition temperature and a chamber pressure; and annealing the first and second layers of substantially amorphous silicon at substantially the deposition temperature or less at an annealing pressure that is different from the chamber pressure.

22. A method according to claim 21, wherein the flow rate of growth gas is about 100 sccm or greater.

23. A method according to claim 21, wherein the flow rate of growth gas is about 200 sccm or greater.

24. A method according to claim 21, wherein the growth gas comprises disilane.

25. A method according to claim 21, wherein at least a portion of the growth gas comprises a gas that is more reactive than silane.

26. A method according to claim 21, wherein at least a portion of the growth gas comprises a gas selected from the group consisting of disilane, silichloroform, and combinations thereof.

27. A method according to claim 21, wherein the growth gas is selected from the group consisting of disilane, silichloroform, and combinations thereof.

28. A method according to claim 21 wherein the chamber pressure during annealing is about 20 mTorr to about 20 Torr.

29. A method of forming hemispherical grain silicon comprising:

forming a first layer of doped substantially amorphous silicon on a substrate that is heated to a deposition temperature during formation of the first layer that is in a range of temperatures above which substantially amorphous silicon would typically be deposited and below which substantially polycrystalline silicon would typically be deposited;

forming a second layer of doped substantially amorphous silicon on the first layer, the second layer being formed at the deposition temperature within a chamber at a chamber pressure, wherein the second layer has a dopant concentration less than a dopant concentration of the first layer; and annealing the first and second layers at substantially the deposition temperature or less at an annealing pressure that is different from the chamber pressure.

* * * * *